(12) United States Patent
Landolt (10) Patent No.: US 6,828,540 B2
(45) Date of Patent: Dec. 7, 2004

(54) IMAGE SENSOR SYSTEM OPERATING WITH SMALL AMPLITUDE SCANNING

(75) Inventor: Oliver Landolt, Mountain View, CA (US)

(73) Assignee: California Institute of Technology, Pasadena, CA (US)

( * ) Notice: Subject to any disclaimer, the term of this patent is extended or adjusted under 35 U.S.C. 154(b) by 78 days.

(21) Appl. No.: 09/682,003

(22) Filed: Jul. 6, 2001

(65) Prior Publication Data

US 2002/0030150 A1 Mar. 14, 2002

Related U.S. Application Data (60) Provisional application No. 60/216,911, filed on Jul. 6, 2000.

(51) Int. Cl.[7] .............................................. H01L 27/00
(52) U.S. Cl. .................. 250/208.1; 250/216; 348/219.1
(58) Field of Search ........................ 250/208.1, 206.1, 250/214 L, 216, 214 R, 214 LA, 214 A, 234; 348/219.1, 246, 247, 322, 202, 203, 205; 382/309, 254

(56) References Cited

U.S. PATENT DOCUMENTS

| 3,986,000 A | * | 10/1976 | McJohnson ............. 235/462.27 |
| 4,581,649 A | * | 4/1986 | Morokawa ................ 348/219.1 |
| 4,607,287 A | * | 8/1986 | Endo et al. .............. 348/219.1 |
| 4,748,507 A | * | 5/1988 | Gural ........................ 348/219.1 |
| 4,887,125 A | * | 12/1989 | Hideshima .................... 355/55 |
| 5,717,200 A | * | 2/1998 | Hashimoto ............... 250/208.1 |

* cited by examiner

Primary Examiner—David Porta
Assistant Examiner—Seung C. Sohn
(74) Attorney, Agent, or Firm—Fish & Richardson P.C.

(57) ABSTRACT

A visual sensor that operates based on received image information with an external applied mechanical vibration. The vibration is used to move the image information relative to the image sensor. The image sensor senses the image information and applies that information to an image processing circuit that produces pulses based on transitions in the image information. Those pulses can be used to characterize the image.

34 Claims, 5 Drawing Sheets

IMAGE SENSOR SYSTEM OPERATING WITH SMALL AMPLITUDE SCANNING

CROSS REFERENCE TO RELATED APPLICATIONS

This application claims priority from provisional application No. 60/216,911, filed Jul. 6, 2000.

FEDERAL RESEARCH STATEMENT

The U.S. Government has certain rights in this invention pursuant to Grant No. N00014-99-0438 awarded by the Office of Naval Research.

BACKGROUND OF INVENTION

An image sensor is a tool that obtains information about the contents of an image. An ordinary camera is one type of image sensor. A visual sensor may extract relevant information from an image obtained by the image sensor.

It may be desirable to incorporate visual data processing into an image sensor. This may be used to reduce the cost of image transmission, and also to minimize the amount of data received by devices which are remote from the image sensor, e.g., chip devices. However, adding local processing into the pixels may reduce the 'efficiency' of use of the semiconductor real estate, i.e., it may reduce the total number of pixels that may be integrated on a given area of semiconductor substrate.

Noise in such image sensors may also decrease the efficiency and effectiveness of the image acquisitions. The signal processing techniques that are used to overcome these noise features may themselves produce undesirable side effects, including additional hardware overhead on the chip, as well as temporal sampling requirements.

SUMMARY OF INVENTION

The present disclosure describes a system of using mechanical movement of an image sensor relative to the scene to find information about the scene in further detail than has been previously provided.

In an embodiment, an image sensor system is described which uses vibration of the image sensor to determine information about an image scene. The information from the vibrating image sensor is used to form pulses at time intervals that depend on the movement of the image sensor. Different embodiments are disclosed of different ways to move the image that is acquired on the image sensor, including circular, elliptical, and random movements.

BRIEF DESCRIPTION OF DRAWINGS

These and other aspects will now be described in detail with reference to the accompanying drawings, wherein.

DETAILED DESCRIPTION

The present application describes a sensor which acquires image data, and processes that image data for the purpose of extracting information about a visual scene being reviewed. In an embodiment, the image sensor may include a mechanical moving part which moves the image sensor in a cyclical way, that is in cycles of one direction, then another direction. These cycles may repeat in a specified way or may be more random. As described herein, this mechanical movement may allow obtaining further information about the image scene.

Figure 1:
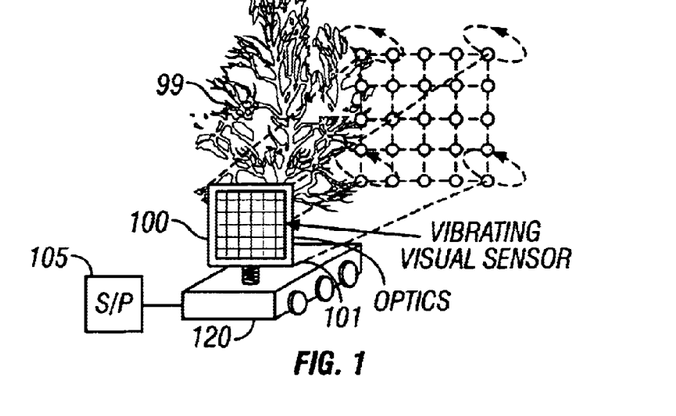
FIG. 1 shows a basic block diagram of the system.

FIG. 1 shows a block diagram of an embodiment illustrating the operating principle of the invention. The embodiment includes an image sensor 100 that includes an array of picture elements, each of which captures information about a scene 99 being imaged. Each picture element includes an array of pixels. Each of the picture elements also has a photoreceptor which may be a photodiode, photogate or any other kind of photoreceptor element. The image sensor may be associated with optics shown generally as 101. This may include, for example, focusing optics which may be for example a single lens. The device may also include signal processing circuitry 105, which encodes the most relevant features of the signal from the photodetector into digital pulses. The timing of those digital pulses, for example, may represent the rate of change of the signal. The digital pulses may then be transmitted in order to represent the information.

In this embodiment, a mechanical scanning device 120 operates to move the image scene relative to the image sensor. The movement may cause the image to move continuously over the array of photoreceptors on the image sensor 101. This, in turn, converts spatial variations of light intensity in the image into temporal fluctuations of light intensity over each photoreceptor.

Figure 2:
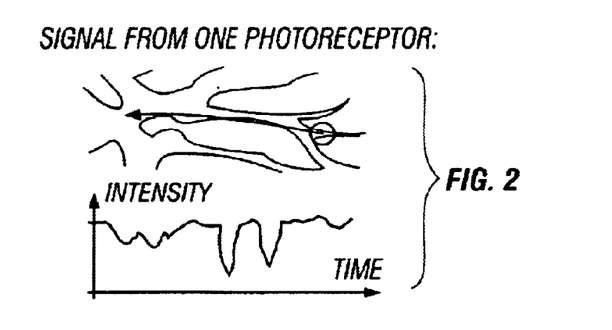
FIG. 2 shows a signal of intensity from photoreceptors.

FIG. 2 shows an example plot of how spatial variations in light intensity of the image are converted into temporal fluctuations of light intensity in each photoreceptor. The temporal fluctuations may include information that has a higher resolution than that which would be allowed by the pixel spacing. For example, if the scanning pattern is known, then local spatial image features may be retrieved from the temporal signals by appropriate signal processing as described herein.

Consider a single dimensional image I(x). I(x) represents a non-changing visual scene that is focused on the surface of an image sensor. This image may be shifted by the mechanical movements according to the present system. The vibrations may be carried out by a velocity v. Each single photodetector therefore detects a light intensity $I_{pix}(t)=I(x_0+v.t)$, where $x_0$ depends on the location of the photoreceptor on the sensor. This transforms the spatial distribution of light intensity within the image into a temporal signal. The spectrum of this temporal signal is related to the spatial spectrum of the image by linear scaling on the frequency axis, as: $f_T = v.f_s$ (1) Where $f_T$ designates the temporal frequency, and $f_S$ designates the spatial frequency in the image plane. Assuming a temporal bandwidth of $f_{Tmax}$, the spatial cutoff for the scanning pixel will be $f_{Smax} f_{Tmax}/v$. The spatial bandwidth of the non scaling image sensor is dependent on the spacing $\Delta x$ of its photo sensors, and may be proportional to $1/(2 \Delta x)$. That is, scanning may improve the spatial resolution, provided that:

$$\frac{f_{T\max}}{v} > \frac{1}{2\Delta x} \quad (2)$$

As described herein, constant velocity scanning may be used along a circular path with a diameter equal or close to the value of the pixel spacing Δx. Using this technique, image features may be detected so long as they cross the scanning path of at least one photoreceptor, even if the image feature is smaller than what would normally be detectable via the specified pixel spacing of the sensor.

This system may provide certain improvements as compared with the prior art. Existing visual sensors that use focal plane processing may provide processing electronics in every pixel. This in turn may increase the space between pixels. Resolution, which may be defined as the thickness of the finest object that can be reliably detected by a sensor, may be decreased since there is more needed spacing between sensors. The present application may increase the resolution of such a visual sensor.

The resolution improvement can be understood by considering a visual scene with a thin line, for example a dark line over a light background. With a conventional visual sensor, if the thin line is thinner than the pixel spacing, then the image may partially or fully end up being between the photoreceptors. The thin dark line may therefore become undetected or undetectable. In contrast, the present application allows small scanning movements to be applied to the image, with a scanning movement having an amplitude at least equal to photoreceptor spacing. This means that at least one photoreceptor will cross the thin line at some point in time.

When this happens, the dark line may produce sharp transitions from light to dark and then dark to light at some point during the image sensor movement. These transitions may be detected, and their timing may be used according to a digital processing signal, to locate the dark line. The location of the dark line is carried out at an effective resolution that may be higher than the pixel spacing.

In addition, the inherent imperfections in a semiconductor formation process may cause random offsets in the integrated circuit that is used to acquire image information. These random offsets cause fixed noise in the image, also called fixed pattern noise. The fixed pattern noise may be minimized by certain processing techniques such as correlated double sampling. However, this system may also reduce or eliminate fixed pattern noise, since the spatial features are extracted from a temporal signal that is delivered by an individual photoreceptor. Even if the different photoreceptors have random offsets, their outputs are not combined or compared. Therefore, fixed pattern noise may be substantially eliminated.

The details of the different embodiments are described herein. A special signal processing chain may be incorporated in each pixel. This may be important, since it may be impractical to send off the chip all continuous waveforms as provided by the photoreceptors. Signal processing is performed locally in every pixel for the purpose of detecting key features in the temporal waveform, and encoding them in a format compatible with off-chip communication and subsequent processing.

Figure 3:
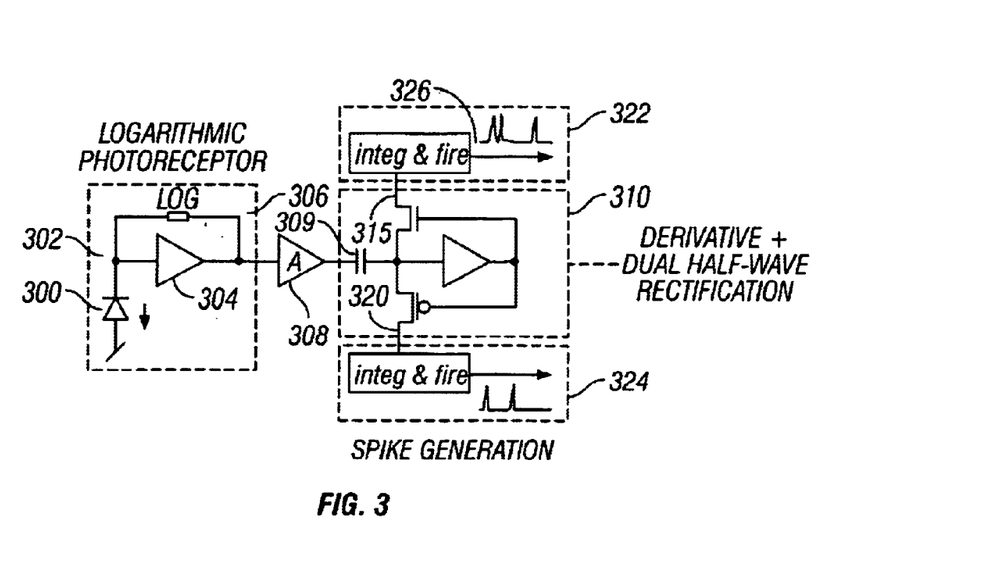
FIG. 3 shows a block diagram of the specific logarithmic photodetector.

The signal processing chain is shown in FIG. 3. In summary, the signal processing includes a logarithmic transformation, followed by rectification and differentiation, and conversion to pulses. The pulse train, in combination with the trajectory of the scanning device can be used to identify the spatial features present in the small image area scanned by this pixel.

In this embodiment, the photoreceptor is a photodiode 300, whose output is proportional to the incoming light intensity. The output 302 is connected to a logarithmic type current to voltage converter circuit 304. This amplifies and differentiates the voltage at 302 with respect to time. The logarithmically detected output 306 is then amplified at 308, and applied to a derivative and half wave rectification circuit 310. Differentiation occurs based on the passage through the capacitor 309. The derivative is half wave rectified, so that both the positive and negative components of the signal are retained separately. A current is delivered at the positive output 315 whenever the light intensity increases. Analogously, a current is present at the negative output 320 whenever the light intensity decreases.

Two separate integrate-and-fire circuits 322, 324 are provided. The integrate and fire circuit 322 is connected to the positive voltage output 31 5. The circuit integrates the incoming current at 315 until the integral reaches a threshold. At that point, the circuit generates a pulse 326 which is connected to reset the integrator. The pulses which are generated may form the final result of the signal processing chain and are transmitted off the chip using a communication bus. The rate at which pulses are generated is proportional to the rate at which the logarithmic voltage 306 changes. The presence and location of the spike can be detected, and the information in this spike may be used to evaluate the nature of the image.

Different sequences of spikes may represent different image information. For example, highly textured surfaces may have a high spike firing rate, and little or no phase locking. Moreover, the sharp edges on the image are phase coded within respect to the scanning cycle. This enables detecting signatures of specific spatial patterns. Gradient information is rate coded, and may be recoverable by low pass filtering. Each of these items may be recovered from motion in the data stream.

The disclosed embodiment uses a CMOS process logarithmic photoreceptor. The CMOS process uses an N well with a P type substrate diode. This may operate to lower the parasitic capacitance. The photodiode may have a dimension of 10 microns by 10 microns to compromise between spatial resolution and photocurrent intensity constraints.

Figure 8A:
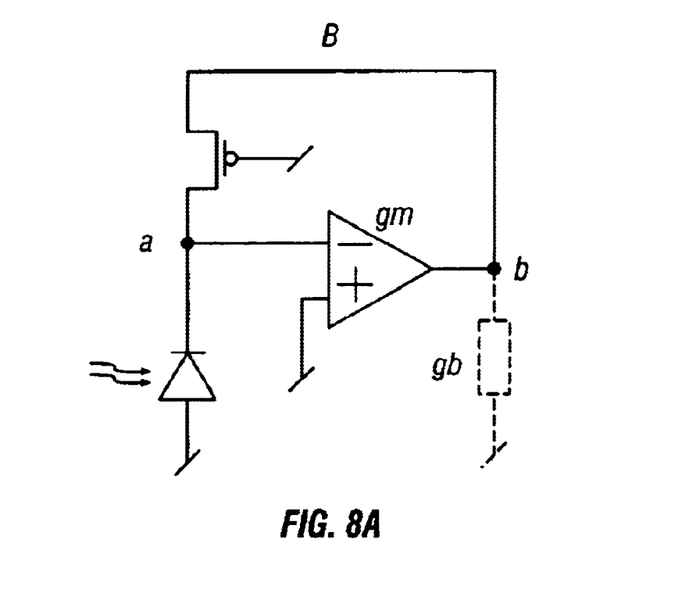
FIGS. 8A and 8B show details of the implementation of the logarithmic amplifier.
Figure 8B:
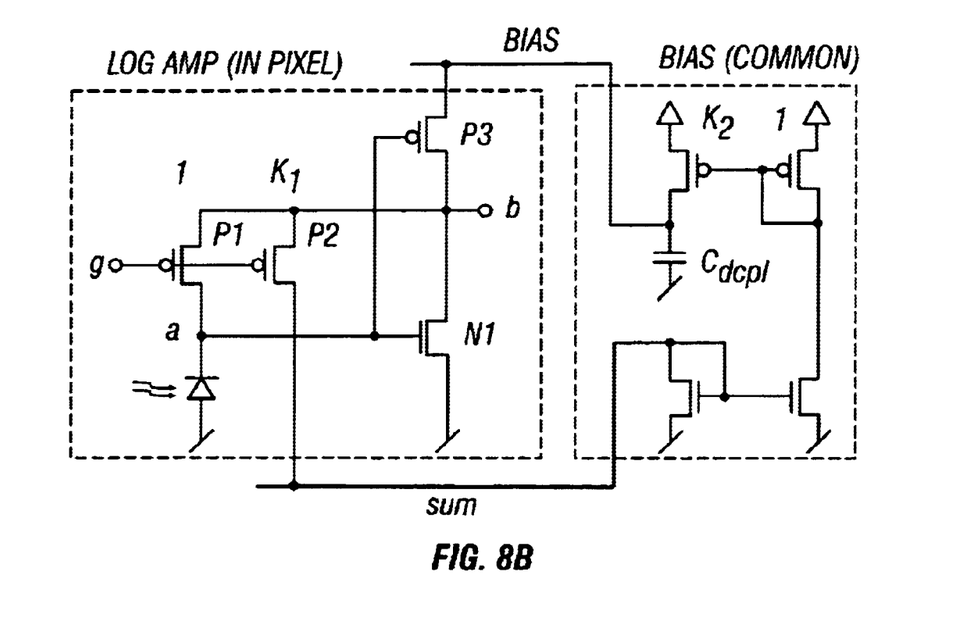

A number of different logarithmic amplifier topologies were investigated, and any of these different amplifier topologies may be used. The basic logarithmic amplifier uses a MOSFET and transconductance element in a feedback circuit of an operational amplifier. FIG. 8a shows a topology which may be used according to the present application, and FIG. 8b shows a transistor level schematic of this topology. This topology is believed by the inventors to produce high bandwidth operation.

The spike train emitted by every single pixel can be combined with the trajectory of the scanning device in order to identify the spatial features present in the small image area scanned by this pixel. For a 1D scanning motion, as the photoreceptor sweeps over an image pattern, the integrators built into the pixel increase toward the firing threshold more rapidly in image portions with steeper gradients. If the same image segment is scanned multiple times either periodically or in a random fashion spikes will not usually be triggered at the exact same location at every pass. However, spikes will tend to occur more frequently in locations of steeper gradients. The probability of spiking at a specific point of an image may be proportional to the gradient of light intensity at this location.

In an embodiment, a gradient of the image can be measured by building a histogram indicating the number of spikes occurring as a function of position over a given integration time. In this histogram, sharp peaks would reveal steep edges, whereas fainter gradients would result in lower spike counts. More sophisticated image information can be retrieved by distinguishing spikes emitted by the positive or the negative integration of the pixel.

It may also be useful to take the direction of scanning movement into account instead of just the position of the scanning device in order to retrieve the sign of the gradient accurately. It should be noted that gradient information can be built for each pixel individually. There is no need to combine information from different pixels, which may eliminate fixed-pattern noise problems that could otherwise result from the computation of gradients. It should also be noted that sensitivity and signal-to-noise ratio can be traded for integration time.

The same feature extraction approach outlined above can easily be extended to the case of 2D scanning. The procedure includes dividing the region scanned by a pixel into smaller areas and counting the number of spikes occurring in each area over a preset integration time. However, the additional dimension permits considerable flexibility in defining individual areas to accommodate application-specific needs. For instance, in order to detect and locate oriented edges, the visual field of a pixel can be divided into elongated, parallel strips. Each strip may correspond to a bin in the histogram. If an edge lies within a strip, this particular bin will receive a large number of spikes. In the example above, each strip plays the role of the receptive field of a spatial feature detector as found in animal brains. The histogram is actually a spatial feature map indicating the extent to which each of a preset number of features can be found in the area covered by a pixel. In the routing of incoming spikes to bins, it may be best to consider the direction in which the scanning device is moving at any given time instead of only its position, because the gradient depends on the direction of scanning by definition. If the location of an image feature does not matter as much as the nature of this feature, the direction of scanning can be used alone to determine the mapping between scanner state and bin number.

Alternatively, a local feature map can be built for each pixel individually, without ever combining information across different pixels.

Figure 7:
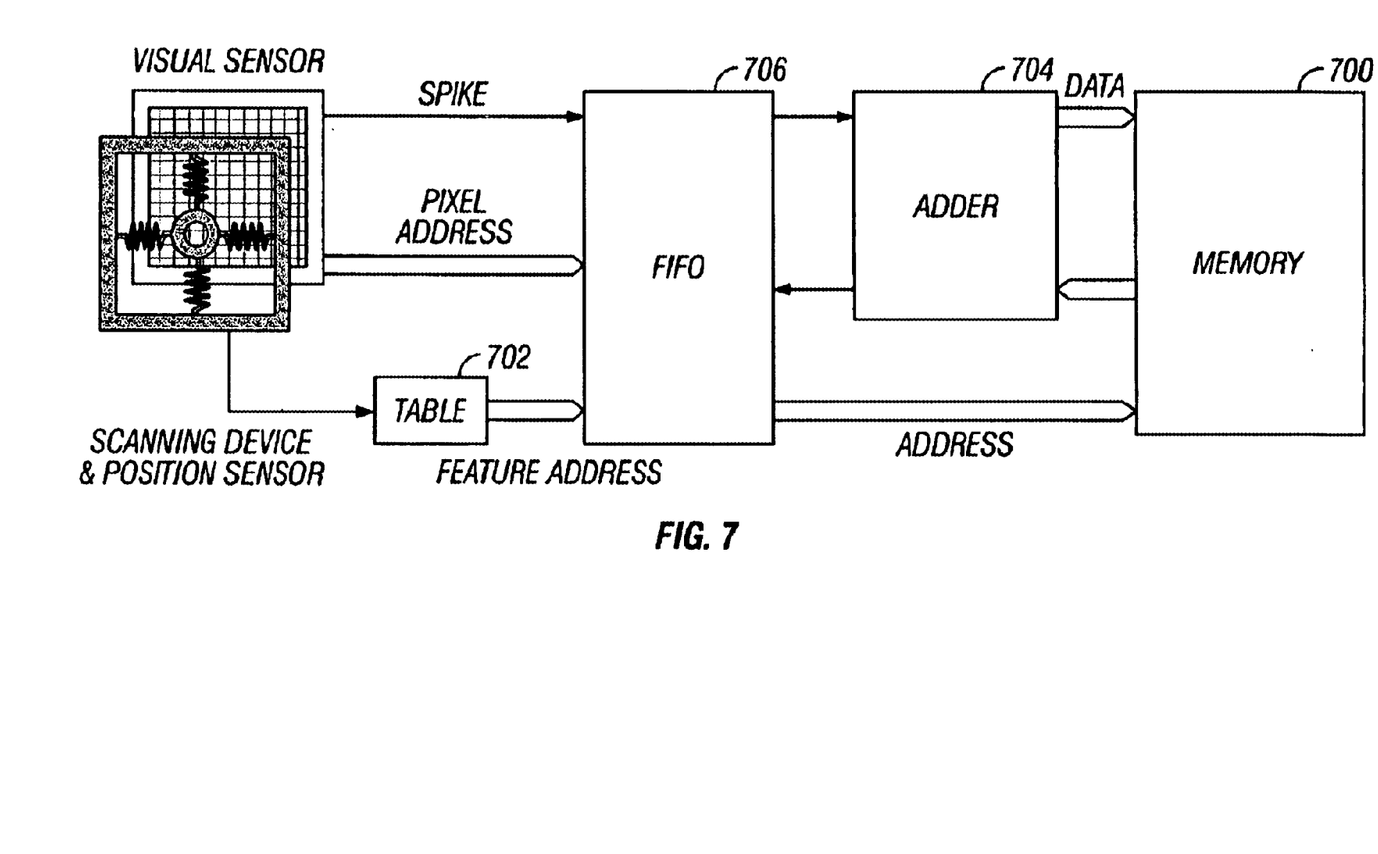
FIG. 7 shows a block diagram of the feature map extractor circuit.

Since spikes are transmitted sequentially by the image sensing front-end described above, histograms can be formed using the circuitry shown in FIG. 7. Each pixel may have its own section of memory 700. The size of the memory may depend on the number of different features which will be detected. The position and/or direction of movement of the scanning device are measured by sensors. This position is converted into the address of the memory cell by the lookup table 702. This lookup table may determine the shapes of the receptive fields. Since scanning movements for the entire pixel array may be identical, this table may be shared between all pixels.

Whenever a spike occurs, the content of the currently selected memory bank is incremented by the adder 704. For overlapping receptive fields, 704 may represent multiple adders operating in parallel, controlling a multidimensional memory bank 700.

A FIFO buffer 706 may be used to relax latency specifications.

After a specified integration time, the memory bank 700 may include a spatial feature map, usable by an image processor.

The definition of the image features detected by this system may be controlled by mapping between scanner state and bin numbers. Only this block needs to be modified to customize the image data processor. This block is shared by all pixels and is not computationally intensive because the bandwidth of its input signals are limited by mechanical time constants (i.e. a few hundreds of Hertz).

The effective resolution of this stage is limited by the accuracy at which the scanning movements can be measured. Whenever the scanning path of a photoreceptor crosses a sharp edge causing an amplitude change exceeding the built-in threshold, at least one spike is reliably generated at this point at every scanning cycle, as shown in FIG. 3. In the case of periodic scanning, the presence and location of this edge can be inferred by the signal processing circuitry, by observing that a spike occurs at the scanning frequency and at an essentially constant phase with respect to the scanning cycle.

If an area of the image contains only a weak intensity gradient instead of a sharp edge, the temporal waveform contains only low amplitude fluctuations proportional to the magnitude of the gradient. In this case, it may require several scanning cycles in inverse proportion to the gradient magnitude before a spike can be generated. This spike may occur any time on an increasing slope of the weak signal. If the image is not changing, it may be nonetheless possible to reconstruct the intensity gradient along the scanned path by histogramming the spikes against the phase of the cycle over multiple cycles. Since the probability of a spike is proportional to the intensity gradient, the shape of the histogram will reflect the first derivative of the input signal. Highly textured surfaces are distinguished by a high firing rate and little or no phase-locking. The pixel signal processing chain encodes visual information in spiking patterns in such a way as to devote a high communication bandwidth and low latency to sharply contrasted spatial variations, and a lower bandwidth to weaker gradients.

The spike trains sent off-chip may be used directly by external hardware extracting image features from the spiking patterns. Such hardware may also take the scanning trajectory into account in order to relate the timing of pulses to the visual space domain. Image feature maps are obtained directly from the pulse streams in real time by using a histogramming approach driven by mechanical vibration data. small area covered by a single scanning pixel can be divided into an arbitrary number of possibly overlapping receptive fields defined according to the features of interest, such as segments of different orientations. A feature detector circuit is associated with each receptive field. Each feature detector counts spikes generated by the pixel while the instant position of the scanning device belongs to its receptive field. The instant position is defined relative to the position at rest. The position is measured by additional sensors independently from the visual data acquisition process. This scheme can be modified by defining receptive fields based on the instant velocity vector of the scanning device instead of or in addition to instant position. In this case, some image features can be detected independently from their location in space. For instance, if the image consists of a pattern of vertical stripes, vertical scanning movements will not elicit any spikes because the image is invariant along this axis. Conversely, horizontal scanning movements will trigger the largest number of spikes. By relating the spiking rate to the instant direction of scanning, the presence of a vertical pattern can be detected independently of the exact location or appearance of the pattern.

Using this scheme, any trajectory may be used for the scanning path. However, the statistics of the scanning device position on the time scale of spike integration affects the feature detection process. In particular, if a region of space is not covered over the time frame of spike counting, image features located in this region will not seen. This constraint must be taken into account in the design of the mechanical components of the microsystem.

The process of mapping instant positions or velocities to receptive fields does not need to be particularly fast, because the scanning device moves very slowly compared to the pulse rate emitted by the chip. In addition, since all pixels necessarily follow the same scanning path, this mapping needs to be performed only once for all pixels. The spike counting hardware must be fast enough to keep up with the total spiking rate (on the order of a few million spikes per second). If spikes are transmitted off-chip one at a time on a shared communication bus, it might not be necessary to devote a full counter to every pixel and every feature detector. A single adder incrementing a memory bank is sufficient for that purpose. This hardware can be implemented using unsophisticated off-the-shelf digital components. This task has not been addressed yet but will be undertaken in the near future. In applications where power consumption minimization is critical, a parallel array of analog switched-capacitance integrators could be used as feature detectors instead.

All of the above may be placed on a custom VLSI chip incorporating a 32 by 32 array of pixels implementing an analog signal processing chain together with a digital communication scheme to transmit visual information outside the chip. The chip may be manufactured in a 0.6 $\mu$m, double poly, triple metal CMOS process. In the embodiment shown in FIG. 1 and described above, the image sensor is vibrated by a vibration mechanism 120.

Any vibration mechanism may be used. Specific techniques of scanning the image sensor over a movement area are disclosed.

Figure 4:
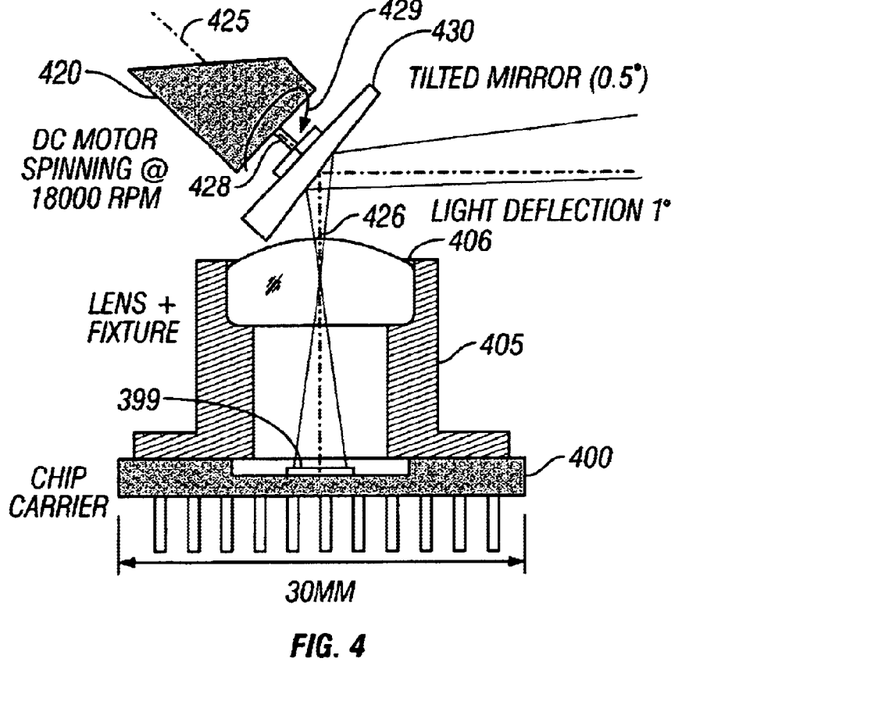
FIG. 4 shows an alternative embodiment using a moving reflective device.

FIG. 4 shows an alternate embodiment, which includes a scanning device based on a moving reflective device. In an embodiment, the moving reflective device may be a moving mirror.

The visual sensing chip 399 may be mounted on a chip carrier 400 as conventional. A housing portion 405 is aligned to the chip and includes inner surfaces 406 which define an area for holding a focusing lens. The focusing lens is therefore held rigidly on top of the imaging chip 399.

A motor 420 is rigidly mounted on top of the focusing lens. The motor may be mounted with its axis of rotation 425 tilted at an angle of about 45 degrees relative to the optical axis 426 of the imaging chip and lens. The shaft 428 of the motor is coupled to a circular mirror 430. The circular mirror may also be slightly tilted, e.g. by one-half degree in this embodiment, instead of being perfectly perpendicular to the shaft 428.

The mirror may spin at a constant velocity or may be driven according to some other driving profile, e.g., a random profile. The movement of the tilted mirror may cause the image to move on the chip surface in a circular pattern. The circular pattern of image movement may have a radius covering about one degree of visual angle. The angular position of the mirror can be used to interpret the timing of pulses generated by the pixel array. The angular position of the mirror may be set and calibrated in advance, or may be electronically determined by image processing using a known image system. An encoder may also be mounted on the shaft 429, which may also determine the position of the mirror.

The above has described the reflection device being a mirror. However, the mirror may be replaced by some other reflection device such as a prism that is mounted perpendicular to the optical axis of the lens. The prism would also be rotated in a way that causes cyclical variation, and hence probably also needs to be driven from its periphery.

Figure 5A:
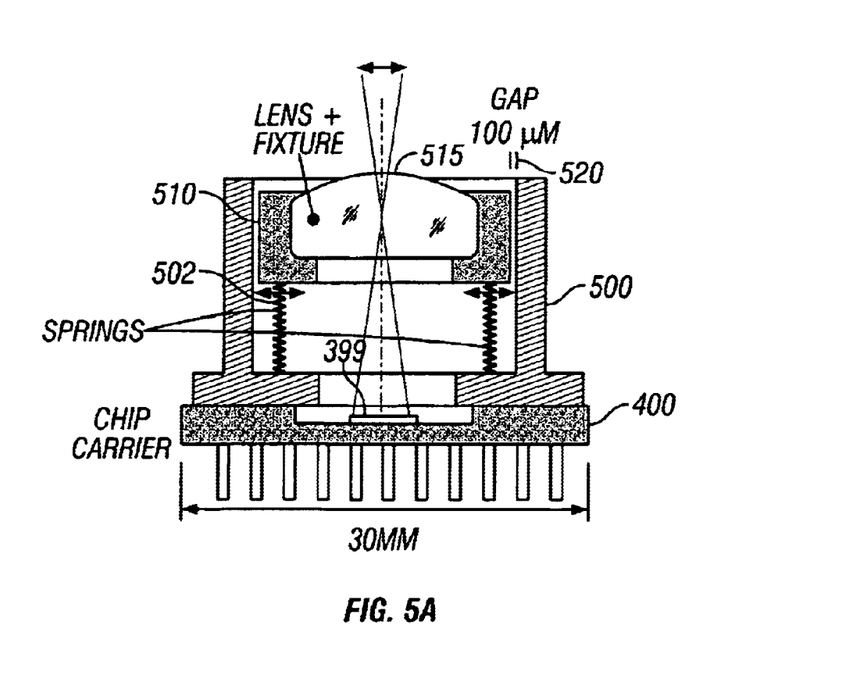
FIGS. 5A–5C shows an embodiment using a moving optical device.
Figure 5B:
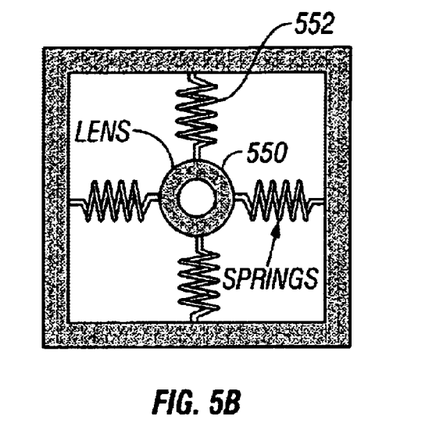
Figure 5C:
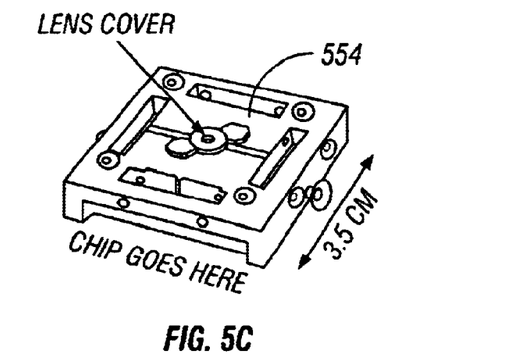

FIGS. 5A–5C show another embodiment in which the lens is spring mounted. FIG. 5A shows an edge view of an embodiment where the lens is held by a carrier, and the springs are located under the carrier. FIGS. 5B and 5C show an alternative mounting arrangement, where the lens is held over a chip. In this alternative arrangement, the lens 550 is held by the springs 552 over the image sensing chip 554. This embodiment may be used for example, in mobile platforms such as robotics or vehicle control. In such mobile platforms, mechanical vibrations are expected due to the inherent movement. An application which include many vibrations may include driving on a rough road, structural vibrations, or shaking inherent to the mode of locomotion. In this embodiment, the mechanical energy of these parasitic vibrations may be used to produce the scanning. The movement is operated without a specific structure used to vibrate the element.

In FIGS. 5A–5C, the chip 400 is again mounted on the chip carrier as conventional. In this embodiment, however, the housing 500 includes a plurality of spring elements 502 therein. The springs hold the lens carrier 510 which itself holds the lens 515. The lens carrier 510 is mounted to have a gap 520 between the lens carrier 510 and housing 500. The springs may be formed such that the lens can move laterally, remained at a fixed distance from the chip surface.

The lens mass and support springs together form a resonant mechanical system. In this embodiment, when the platform carrying this device is vibrated, the lens will sinusoidally oscillate with respect to the chip 399 at the resonant frequency. In this way, random vibrations being applied to the platform may cause a two-dimensional scanning pattern close to a well behaved ellipsoid, at a known frequency related to resonant characteristics of the system. This operation may occur best when the spectrum of the applied mechanical vibration includes other energy in the vicinity of the resonant frequency.

In the lens moving embodiments, the position of the lens may be found by differentially measuring capacitance between lens fixture and the housing 500.

This embodiment may also be used in a situation where the movement power from the environment is not sufficient to excite the system to its resonance condition. In this latter situation, the springs 502 may include piezoelectric actuators as part of their structure.

Other improvements may also be carried out. The above embodiments may operate best when the visual scene and its illumination conditions remain constant over time. Illumination often changes over time, however, due to different features such as AC powered light sources. These fluctuations may interfere with the scanning process. In an embodiment, the photoreceptor current may be scaled by a baseline signal that is proportional to the illumination intensity. This baseline signal may be obtained by spatial averaging of incoming light over a total field of view.

The visual scene itself may change because of independent object motion. This may cause temporal aliasing, as in normal sensors.

In an embodiment, the visual sensor operates at a scanning frequency of about 300 Hz with a photoreceptor bandwidth of 10 kHz. Photoreceptor spacing is fixed at 68.5 microns. The scanning path as described above may be circular, with the diameter equal to the pixel spacing. Using these preferred parameters, the spatial resolution in the image plane along the scanning path may be on the order of 5.5 microns. This would translate to a resolution of about 0.02 degrees for focal length of 8 mm.

In one embodiment, the photoreceptor could be smaller than the spatial resolution in the image plane. In an embodiment, however, the photoreceptor may be 10 microns by 10 microns in order to facilitate formation. The chip may be fabricated as a 0.6 Micron, triple metal CMOS fabrication process, designed for a supply voltage of three volts, having a pixel array of two mm by two mm, with an entire chip area of about 10 square mm.

Figure 6:
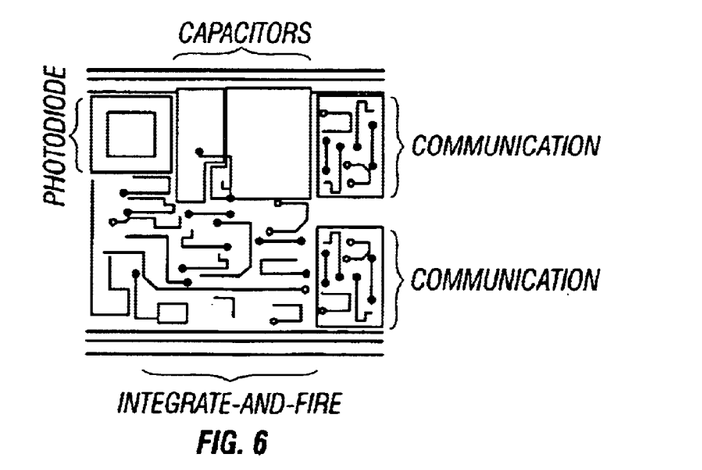
FIG. 6 shows a layout of a single pixel.

A single pixel layout is shown in FIG. 6. The system uses vertically interleaved and overlapping stripes of metal 2 and metal 3 for light shielding and routing of power and global signals. The metal one layer is used for local interconnects, and as horizontal lines for communication of spikes. Although only a few embodiments have been disclosed in detail above, other modifications are possible. For example, the above has described only a few different techniques of moving the image received relative to the image sensor. Many other techniques of receiving this image may be contemplated. Moreover, other photoreceptor systems and other signal processor systems may be used.

All such modifications are intended to be encompassed within the following claims.

What is claimed is:

1. A system, comprising:
    an image sensor having an array of sensing pixels, each sensing pixel comprising a photoreceptor responsive to light and a pixel processing circuit to receive and process output from said photoreceptor;
    an optical device to direct input light from a scene to said image sensor; and
    a device operable to move said image sensor and said optical device relative to each other to cause an image of the scene to move relative to said image sensor,
    wherein each pixel processing circuit produces temporal pulses in response to a variation in light received by a respective sensing pixel caused by the image moving relative to said image sensor, and said temporal pulses have spatial information of the image with a spatial resolution pitch less than a spacing between two adjacent sensing pixels.

2. The system as in claim 1, wherein each pixel processing circuit includes:
    an amplifier to amplify a temporal variation in output from a corresponding photoreceptor, and
    a pulse generation circuit to process output from said amplifier and to produce said temporal pulses.

3. The system as in claim 2, wherein said pulse generation circuit includes:
    a first circuit that generates temporal pulses in response to a temporal increase in the output from said amplifier, and
    a second circuit that generates temporal pulses in response to a temporal decrease in the output from said amplifier.

4. The system as in claim 3, wherein said pulse generation circuit includes a threshold mechanism to generate a pulse when the output from said amplifier reaches a threshold value.

5. The system as in claim 1, further comprising a feature map extractor circuit coupled to temporal pulses from said array of sensing pixels and operable to extract spatial features of the image from said temporal pulses.

6. The system as in claim 5, wherein said feature map extractor circuit builds a histogram indicating a number of temporal pulses from each of said sensing pixels over a given integration time to form a spatial intensity gradient map of the image received by said image sensor.

7. The system as in claim 5, wherein said feature map extractor circuit processes signals from said sensing pixels separately in extracting said spatial features of the image.

8. The system as in claim 5, wherein said feature map extractor circuit includes:
    a memory device having a lookup table having image pixel addresses derived from relative positioning information between the optical device and said image sensor;
    an adder circuit to add a number of pulses from each and every sensing pixels; and
    an image feature memory device having memory cells to receive and store the number of pulses from each every sensing pixels.

9. The system as in claim 8, wherein said feature map extractor circuit further includes a FIFO buffer having an input side connected to said image sensor and said memory device have said lookup table and an output side connected to said adder circuit and said image feature memory device.

10. The system as in claim 1, wherein said optical device includes a mirror operable to rotate.

11. The system as in claim 1, wherein said optical device includes a lens.

12. The system as in claim 11, wherein said lens is moved by an external vibration, and forms a resonant system that moves at a speed proportional to resonance in the system.

13. The system as in claim 1, wherein said device operable to move said sensor and said optical device relative each other randomly.

14. The system as in claim 1, wherein said device operable to move said sensor and said optical device relative each other cyclically.

15. The system as in claim 1, further comprising a processing circuit which encodes changes in said output which are either in positive directions or negative directions into said pulses.

16. The system as in claim 1, wherein said pixel processing circuit comprises a logarithmic amplifier.

17. The system as in claim 16, wherein said pixel processing circuit further comprises a differentiation element, and a half wave rectification element which converts both positive and negative signals into a common level.

18. The system as in claim 1, wherein said optical device comprises a prism.

19. A method, comprising:
    causing an optical image to move relative to an image sensor having an array of sensing pixels;
    using a pixel processing circuit in each sensing pixel to measure a variation in received light caused by the image moving relative to said image sensor to produce temporal pulses encoded with spatial feature information of the image with a spatial resolution pitch less than a spacing between two adjacent sensing pixels; and
    processing temporal pulses from the sensing pixels to extract the encoded spatial feature information of the image.

20. The method as in claim 19, wherein the processing includes correlating the relative motion between the optical image and the image sensor to the temporal pulses.

21. The method as in claim 19, wherein temporal pulses from each sensing pixel are processed independently from other sensing pixels to mitigate fixed pattern noise.

22. The method as in claim 19, further comprising encoding changes in pulses which are either in positive directions or negative directions into the pulses.

23. The method as in claim 19, further comprising using a logarithmic amplifier in each sensing pixel to process each signal generated from received light.

24. The method as in claim 19, further comprising:

encoding changes in pulses which are either in positive directions or negative directions into said digital pulses, and converting both positive and negative signals into a common level.

25. The method as in claim 19, further comprising using a moving reflective device to cause the relative motion between the optical image and the image sensor.

26. The method as in claim 25, wherein the moving reflective device includes a mirror and the method further comprising rotating the mirror to cause the relative motion.

27. The method as in claim 19, further comprising using a moving lens to cause the relative motion between the optical image and the image sensor.

28. The method as in claim 27, further comprising cause the moving lens to move by an external vibration, wherein the moving lens forms a resonant system that moves at a speed proportional to resonance in the system.

29. The method as in claim 19, wherein the optical image is moved relative to the image sensor cyclically.

30. The method as in claim 19, wherein the optical image is moved relative to the image sensor randomly.

31. The method as in claim 19, further comprising:

logarithmically detecting received light to produce an output;

using a derivative and half wave rectification circuit to process the output to retain both positive and negative components of the output.

32. The method as in claim 19, further comprising using information about phase locking of the pulses to determine information about a spatial pattern in the optical image.

33. The method as in claim 19, further comprising obtaining a histogram indicating a number of spikes occurring as a function of position of a given integration time, and using the histogram to determine information about the optical image.

34. The method as in claim 19, further comprising using a moving prism to cause the relative motion between the optical image and the image sensor.

* * * * *